US007825680B2

(12) United States Patent
Nurmi et al.

(10) Patent No.: US 7,825,680 B2
(45) Date of Patent: Nov. 2, 2010

(54) COMPONET SUPPLIED WITH AN ANALOG VALUE

(75) Inventors: Juha H-P Nurmi, Salo (FI); Jussi Koskela, Kaarina (FI)

(73) Assignee: Nokia Corporation, Espoo (FI)

( * ) Notice: Subject to any disclaimer, the term of this patent is extended or adjusted under 35 U.S.C. 154(b) by 1108 days.

(21) Appl. No.: 11/478,561

(22) Filed: Jun. 28, 2006

(65) Prior Publication Data

US 2008/0001935 A1 Jan. 3, 2008

(51) Int. Cl.
*G01R 31/00* (2006.01)
(52) U.S. Cl. ...................................................... 324/770
(58) Field of Classification Search ................. 324/770, 324/765, 158.1, 763; 257/48; 438/14–18
See application file for complete search history.

(56) References Cited

U.S. PATENT DOCUMENTS 5,576,730 A 11/1996 Shimada et al.
6,847,223 B2 * 1/2005 Nara et al. .................. 324/770
6,985,003 B2 * 1/2006 Li et al. ...................... 324/770
2002/0070750 A1 6/2002 Fujita
2003/0151587 A1 8/2003 Yamashita
2005/0122300 A1 6/2005 Makuuchi et al.

FOREIGN PATENT DOCUMENTS

WO 2005/010600 2/2005

* cited by examiner

*Primary Examiner*—Ha Tran T Nguyen
*Assistant Examiner*—Tung X Nguyen
(74) *Attorney, Agent, or Firm*—Alfred A. Fressola; Ware, Fressola, Van Der Sluys & Adolphson LLP

(57) ABSTRACT

An apparatus comprises at least one component arranged to be supplied with at least one analog value. In order to enable a testing of the at least one component, the apparatus further comprises at least one comparator configured to compare at least one analog value, which corresponds to at least one analog value supplied to the at least one component, with at least one analog value read from the at least one component. The comparator is moreover configured to provide a result of the comparison.

24 Claims, 11 Drawing Sheets

COMPONET SUPPLIED WITH AN ANALOG VALUE

FIELD OF THE INVENTION

The invention relates to components that are supplied with at least one analog value and to a testing of such components. The invention relates more specifically to an apparatus and a device comprising such a component and to a method dealing with such a component.

BACKGROUND OF THE INVENTION

An exemplary component that is supplied with analog values is a display panel.

Mobile phones, personal digital assistants (PDA) and many other electronic devices comprise a display panel for presenting information to a user. The display panel usually belongs to a display module. A common type of a display module is, for example, a liquid crystal display (LCD).

FIG. 1 presents an arrangement in an electronic device including such a display module.

The display module 10 comprises a display panel 11, a display driver or controller 12 and a flexible printed circuit (FPC) 15. The display module 10 is connected to a base band section 16 of the device via the flexible printed circuit 15. The base band section 16 comprises an engine 17, which is able to provide digital data for a respective image that is to be presented to a user. The display driver 12 receives image data from the base band engine 17 via the flexible printed circuit 15 and controls the display panel 11 accordingly.

When an electronic device comprising a display module is manufactured, it is usually checked on the production line whether the display module of the assembled or partially assembled device is functioning properly. This is currently realized by means of an electrical test and an additional visual test.

The electrical test can be used for checking whether a functioning connection has been established between a base band section and a display module. Such an electrical test is illustrated in FIG. 2.

FIG. 2 is a schematic block diagram, which presents like FIG. 1 the display module 10 and the base band engine 17, which are interconnected by an interface including the flexible printed circuit 15.

FIG. 2 shows some more details of the display driver 12. The display driver 12 comprises a frame memory 13 and a digital-to-analog-converter (DAC) 14. The frame memory 13 is linked via the DAC 14 to the display panel 11. Digital data for a respective image frame that is provided by the base band engine 17 via the interface to the display module 10 is stored in the frame memory 13. The DAC 14 converts the digital image data from the frame memory 13 into analog image data and writes it to the display panel 11.

For the electrical test, the base band engine 17 writes data to the frame memory 13 and reads the data from the frame memory 13 again, in order to verify whether the required connection is given.

The visual test is used in addition for checking whether the display panel 11 itself is working properly. This may include for instance checking whether all lines of the display panel 11 are working properly.

The visual test can be performed by a person or by test equipment, like a camera. It can be based on different kinds of predetermined test patterns that are presented on the display panel 11, for example a 1×1 checkerboard, a full white image, a full black image, etc.

Thus, two separate tests are needed for checking the display module. Further, visual tests are costly due to the required investments, time-consuming and error-prone.

SUMMARY OF THE INVENTION

The invention enables an improved testing of a component of an electrical device, like a display panel.

An apparatus is proposed, which comprises at least one component arranged to be supplied with at least one analog value. The apparatus further comprises at least one comparator configured to compare at least one analog value, which corresponds to at least one analog value supplied to the at least one component, with at least one analog value read from the at least one component and to provide a result of the comparison.

Moreover, a device is proposed, which comprises the same features as the proposed apparatus, and in addition a processor configured to receive a comparison result from the comparator.

Moreover, an apparatus is proposed, which comprises means for being supplied with at least one analog value, and means for comparing at least one analog value, which corresponds to at least one analog value supplied to the means for being supplied with at least one analog value, with at least one analog value read from the means for being supplied with at least one analog value and for providing a result of the comparison.

Finally, a method is proposed, which comprises receiving at least one analog value, which corresponds to at least one analog value supplied to a component, receiving at least one analog value read from the component, comparing the received analog values, and providing a result of the comparison.

The invention proceeds from the consideration that many components that are supplied with an analog value can be assumed to be working properly, in case the supplied value is essentially the same as a value that can be read from the component. It is therefore proposed that the proper functioning of a component that is supplied with an analog value is checked by comparing the value that is supplied to the component with a value that is read from the component.

The proposed method could thus also be considered as a method for testing a component that is supplied with at least one analog value.

It is an advantage of the invention that it is easy to implement and that it enables a cheap and reliable testing of a component that is supplied with at least one analog value.

The analog value can be an analog value of any type, for example a voltage or a current, etc.

The at least one component could comprise for example an analog memory, to which analog values representing analog memory data are supplied. In this case, the invention allows checking, for example, whether a data source is connected properly to the analog memory and whether all storage entities of the analog memory are working properly.

The at least one component is not limited to analog memories, though. It could also comprise for example a common voltage plane, to which a common voltage is supplied as an analog value. In this case, the invention allows checking, for example, whether a voltage source supplying the common voltage is connected properly to the common voltage plane and whether the common voltage plane has a proper conductivity.

If the at least one component comprises an analog memory, such a memory could be for example, though not exclusively, a display panel which stores image data from one image refresh cycle to the next. In this case, the at least one analog value could represent image data and it could be for instance in the form of voltage levels.

In case the invention is employed for a display panel and the at least one analog value represents image data, the functioning of the display panel can be tested without any visual inspection on the production line. That is, neither a camera nor a person is required for the testing.

If the invention is employed for an analog memory, the least one analog value could comprise an analog value for each storage entity of this memory, and the comparator could compare analog values separately for each storage entity of the memory.

For example, the at least one analog value could comprise an analog value for each pixel of a display panel, and a comparator could compare analog values separately for each pixel of the display panel. Such a comparison could provide information on exactly how many pixel faults are found in the display panel.

A display panel could comprise for example a capacitor for each pixel of the display panel. An analog value provided to the display panel could then be a voltage loading a capacitor of a respective pixel, while an analog value read from the display panel could be a voltage across a capacitor of a respective pixel.

The loading of such capacitors could be controlled by switching elements, like transistors. The display panel could comprise for example a switching element for each pixel of the display panel. A switching element of a respective pixel could then be arranged to enable in a predetermined switching state a loading of a capacitor of the pixel and a reading of a voltage across the capacitor.

In one embodiment of the invention, a memory is arranged to provide digital values representing image data to a digital-to-analog converter. The memory could be for example a frame memory storing data for a respective image frame. Each digital value could then indicate a gray scale value of another pixel of the image frame. The digital-to-analog converter could be configured to convert digital values received from the memory into analog values. The analog values can then be supplied to a display panel and/or to a comparator.

The comparator is indicated to compare a first analog value corresponding to an analog value supplied to the at least one component with a second analog value read from the at least one component. The first analog value could be for example equal to, basically equal to, or having a predetermined relation to an analog value supplied to the at least one component. Further, the comparator could be provided with the first analog value and the second analog value in various ways.

For example, in case the at least one component comprises an analog memory, like a display panel, the at least one analog value could first be supplied to the analog memory, where it is stored. In particular, analog values for all storage elements of the analog memory could first be supplied to the analog memory. At least one analog value of the same value could then be provided to the comparator, which receives in addition at least one analog value read from the analog memory.

In one embodiment of the invention, a switching arrangement is arranged to supply in a first switching state at least one analog value from a signal supply unit to the at least one component. In a second switching state, the switching arrangement provides at least one analog value from the signal supply unit to the at least one comparator and provides at least one analog value read from the at least one component to the at least one comparator.

In case the at least one component comprises another component than an analog memory, like a common voltage plane, a signal supply unit could provide at least one analog value and supply this at least one analog value in parallel to the at least one component and to the at least one comparator. The comparator could then receive in parallel the at least one analog value from the signal supply unit and the at least one analog value read from the at least one component.

The processor of a device according to the invention could belong for example to a base band engine of the device. The processor could be configured to present the comparison results to a user, possibly after a preceding processing of the results, for example determining the detected number of faults. Further, it could trigger and/or control the comparison by the comparator, for example based on an input by user or based on an automated input on the production line.

The apparatus according to the invention could be any device comprising a component, which is supplied with an analog value and of which the functionality is to be tested. It could be for example a display module, like an LCD. In this case, the comparator and/or a switching arrangement could be arranged for instance in a display driver or between a display driver and a display panel.

The device according to the invention could be any device comprising a component, which is supplied with an analog value and of which the functionality is to be tested. It could be for example a mobile terminal or a PDA, etc.

It is to be understood that any described embodiment can be combined with any other described embodiment and as well with various other embodiments.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 1:
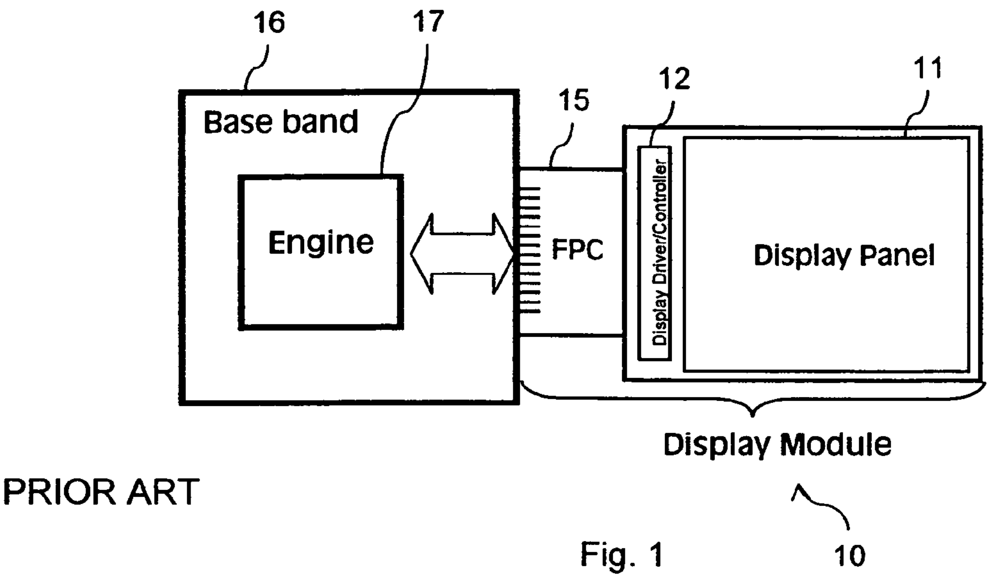
PRIOR ART Fig. 1
FIG. 1 is a schematic diagram of an arrangement comprising a display module.
Figure 2:
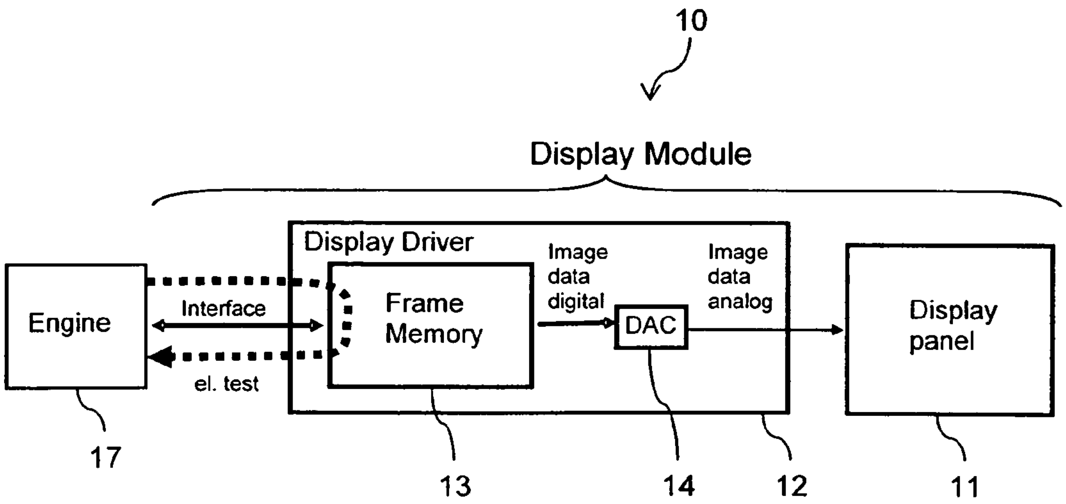
PRIOR ART Fig. 2
FIG. 2 is a schematic block diagram of an arrangement comprising a display module and illustrating an electrical testing.
Figure 3:
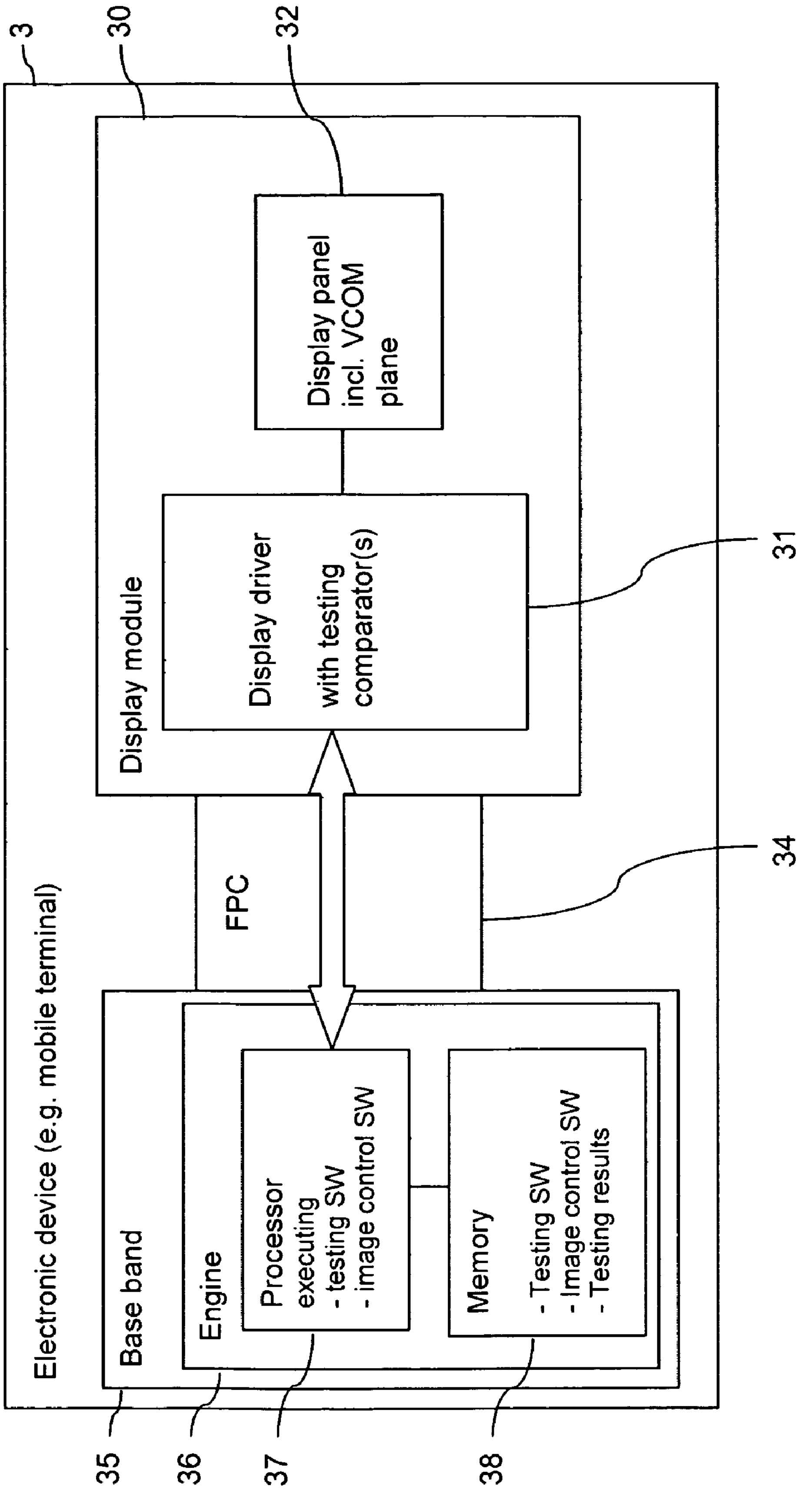
FIG. 3 is a schematic block diagram of an exemplary device according to an embodiment of the invention.

FIG. 3 is a block diagram of an exemplary electronic device, which enables an improved testing of a display module in accordance with one embodiment of the invention.

The electronic device 3 could be for example a mobile terminal. It comprises a display module 30 with a display driver 31 and a display panel 32. The display panel 32 could be for example a Quarter Video Graphics Array (QVGA) LCD display panel having 240×320 pixels and requiring a refresh rate of 60 Hz. It has to be noted, though, that the display panel could also be of another type.

The electronic device 3 further comprises a base band section 35 with a base band engine 36. The base band engine 36 comprises all components that are required for a base band processing in the electronic device 3. The base band engine 36 may comprise to this end a processor 37 that is configured to execute software program code. The software program code may be stored in a memory 38 of the base band engine 36 for retrieval by the processor 37 whenever required. The software program code comprises a testing software program code for testing the display module 30. In addition, it may comprise for instance an image control software program code, which supports a presentation of images to a user. The memory 38 could further provide a storage section for storing testing results.

The display module 30 moreover comprises a flexible printed circuit (FPC) 34, which connects the display module 30 to the base band section 35.

FIGS. 4 to 10 illustrate more details of the display module 30.

Figure 4:
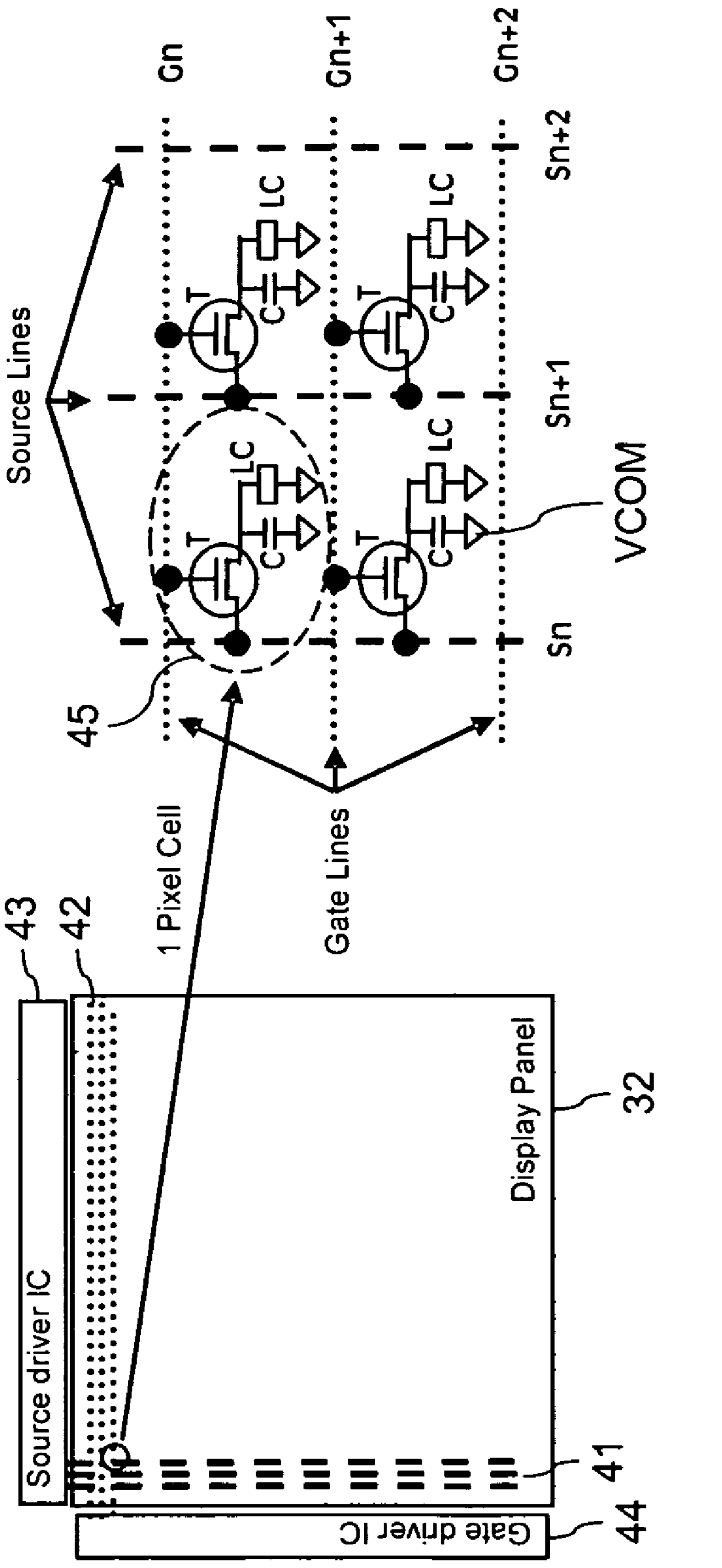
FIG. 4 is a schematic diagram illustrating details of the display panel of a display module of the device of FIG. 3.

FIG. 4 is a diagram illustrating the structure of the display panel 32. As indicated on the left hand side of FIG. 4, a front plane of the display panel 32 is covered by a grid of conductive source lines 41 arranged in columns (dashed lines) and of conductive gate lines 42 (dotted lines) arranged in rows. The source lines 41 are controlled by a source driver IC 43, which could also be placed on the display driver 31. The gate lines 42 are controlled by a gate driver IC 44, which could also be placed on the display driver 31.

The front plane of the display panel 32 further comprises a number of pixel cells, which provide the visible output to a user. The pixel cells are arranged in columns and rows. Each pixel cell is associated to another intersection and thus another pair of a source line 41 and a gate line 42. This is illustrated on a larger scale on the right hand side of FIG. 4, which shows the area of three source lines Sn, Sn+1, Sn+2 and three gate lines Gn, Gn+1, Gn+2. In addition, four pixel cells are shown, which are associated to the intersection between source line Sn and gate line Gn, the intersection between source line Sn+1 and gate line Gn, the intersection between source line Sn and gate line Gn+1, and the intersection between source line Sn+1 and gate line Gn+1, respectively.

The components of one of the pixel cells 45 are circled with a dashed line. Each pixel cell 45 comprises a transistor T. A gate of the transistor is connected to the associated gate line Gn, Gn+1. A source of the transistor T is connected to the associated source line Sn, Sn+1. The drain of the transistor T is connected on the one hand via a capacitor C to a common voltage (VCOM) and on the other hand via a liquid crystal element LC to the common voltage. It is to be understood that the pixel cells 45 could also be structured differently. For example, instead of transistors T, some other type of switches could be employed.

The source driver 43 is configured to receive voltage values representing analog image values for a respective pixel and to output these voltage values to the source lines Sn, Sn+1, Sn+2, etc. The source driver 43 more specifically collects voltage values for a respective row of pixels and outputs the voltage values to the associated source lines Sn, Sn+1, Sn+2, etc., in parallel for one row at a time.

The gate driver 44 is configured to receive a control signal indicating a specific gate line and to activate this gate line Gn, Gn+1, Gn+2, etc., by applying a predetermined gate voltage to the indicated gate line.

The pixel cells 45, which are associated to an activated gate line, are updated with the voltage values currently provided to the source lines Sn, Sn+1, Sn+2, etc. Thus, the pixels of one row are updated at the same time.

Figure 5:
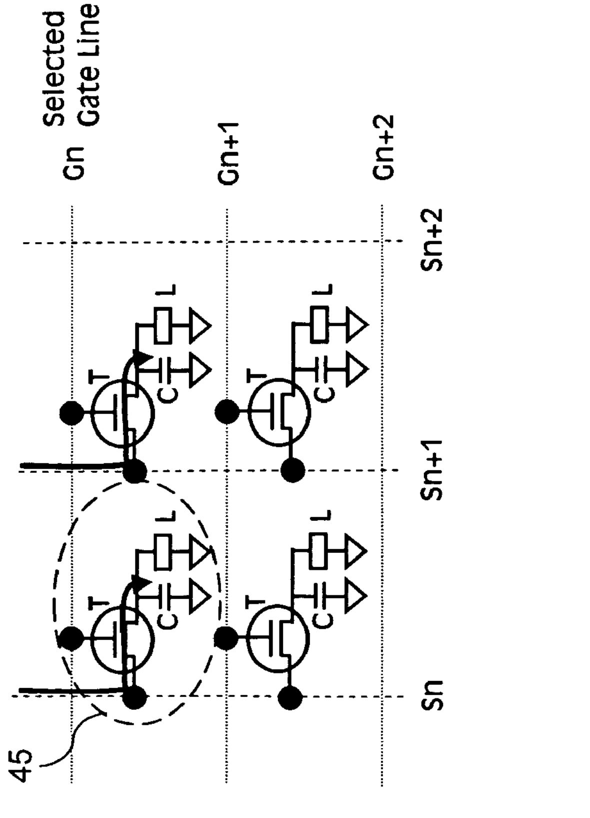
FIG. 5 is a schematic diagram illustrating a writing of values to pixels of the display panel of FIG. 4.
Figure 6:
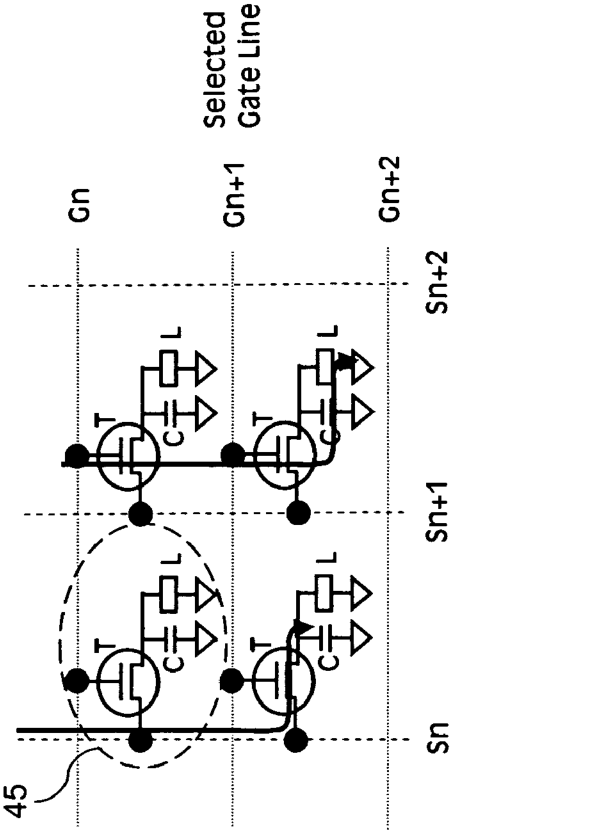
FIG. 6 is a further schematic diagram illustrating a writing of values to pixels of the display panel of FIG. 4.

FIGS. 5 and 6 illustrate the update of pixel cells in two rows n and n+1. Both, FIG. 5 and FIG. 6, present to this end the same area of the display panel 32 as depicted on the right hand side of FIG. 4.

For updating the $n^{th}$ row of pixel cells 45, the analog image values for row n are outputted on source lines Sn, Sn+1, Sn+2, etc. Further, a gate line Gn is selected and provided with a control voltage. A gate line controls all transistors T that are connected to it. That is, the transistors T connected to gate line Gn are switched to a conductive state, while all other transistors T are kept in a non-conductive state.

The applied analog image values can now flow in form of a respective current through the conductive transistors T and start to charge the associated capacitors C, and thus to load a respective memory. The loading is continued until the voltage on gate line Gn is switched off and another gate line Gn+1, Gn+2 is selected. The loading of the capacitors C also controls the liquid crystal elements LC of the respective pixel cell 45. The loaded capacitors C of row n keep their voltage and define thereby the visible gray level of the associated liquid crystal elements LC and thus of a respective pixel of an image frame, until the same gate line Gn is selected again and a loading with a new value is performed.

The loading of the capacitors C of two pixel cells 45 associated to gate line Gn is illustrated by arrows in FIG. 5, while a corresponding loading of the capacitors C of two pixel cells associated to gate line Gn+1 is illustrated by arrows in FIG. 6.

Figure 7:
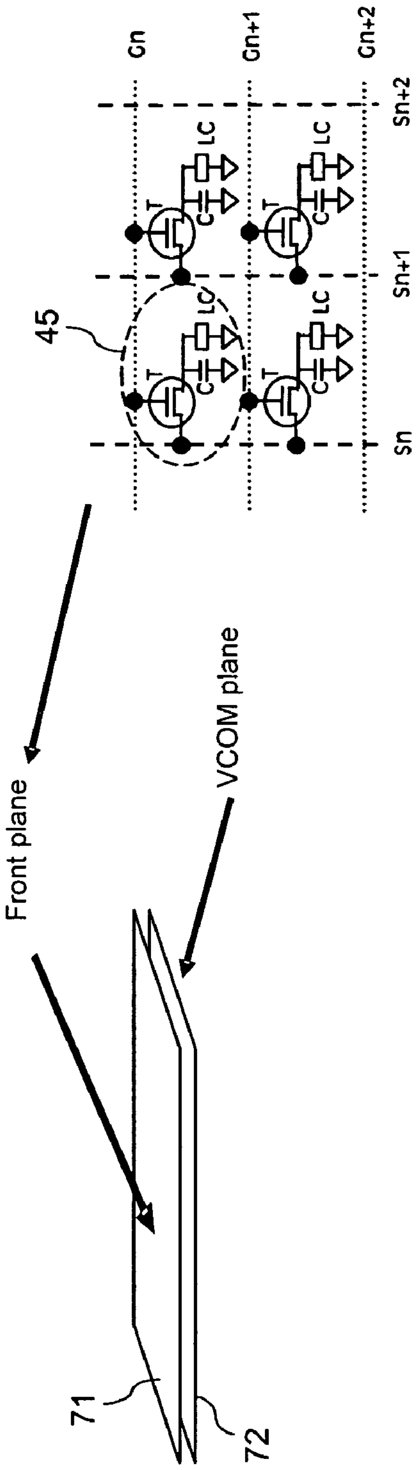
FIG. 7 is a schematic diagram illustrating the arrangement of a VCOM plane in the display module of the device of FIG. 3.

FIG. 7 is a schematic diagram illustrating the common voltage supply in the display panel 32.

In addition to a front plane 71 for the source lines Sn, Sn+1, Sn+2, the gate lines Gn, Gn+1, Gn+2 and the pixel cells 45, the display panel 32 comprises a common voltage (VCOM) plane 72.

The VCOM plane 72 is an electrically conductive plane, which is placed directly under the front plane 71, so that the capacitors C and the liquid crystal elements LC of the pixel cells 45 on the front plane 71 can be connected to this VCOM plane 72.

Different voltage levels can be used between gate lines Gn, Gn+1, Gn+2, source lines Sn, Sn+1, Sn+2 and VCOM plane 72.

Figure 8:
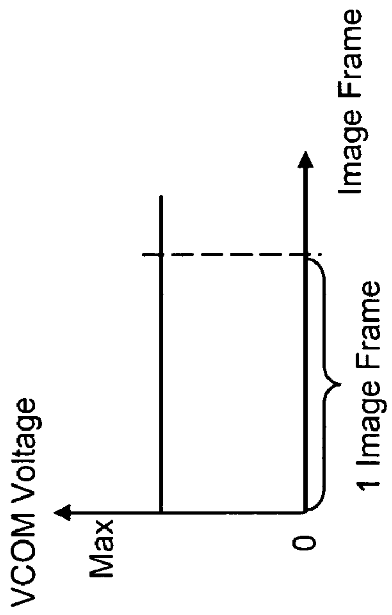
FIG. 8 is a diagram illustrating a first possible course of a common voltage applied to the VCOM plane of FIG. 7.
Figure 9:
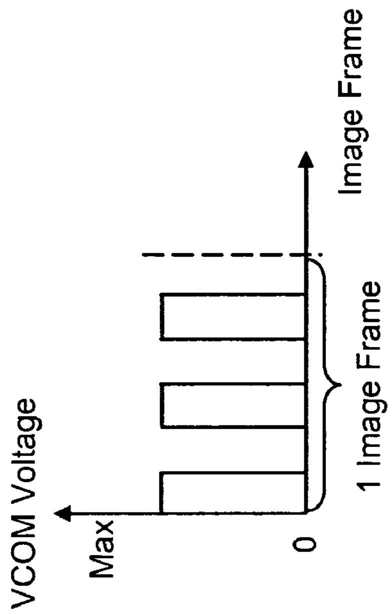
FIG. 9 is a diagram illustrating a second possible course of a common voltage applied to the VCOM plane of FIG. 7.

The VCOM plane 72 is supplied with a common voltage. The common voltage can be a static voltage, as illustrated in FIG. 8. FIG. 8 is a diagram depicting the common voltage VCOM over the image frames. It can be seen that the value of the common voltage is constant while the image on the display panel is updated. Alternatively, the common voltage could be changed during the update of a single image frame. An example of such a changing common voltage is presented in FIG. 9. FIG. 9 is a diagram depicting the common voltage VCOM over the image frames. It can be seen that the value of the voltage changes between a maximum value and a minimum value while the image on the display panel is updated.

Figure 10:
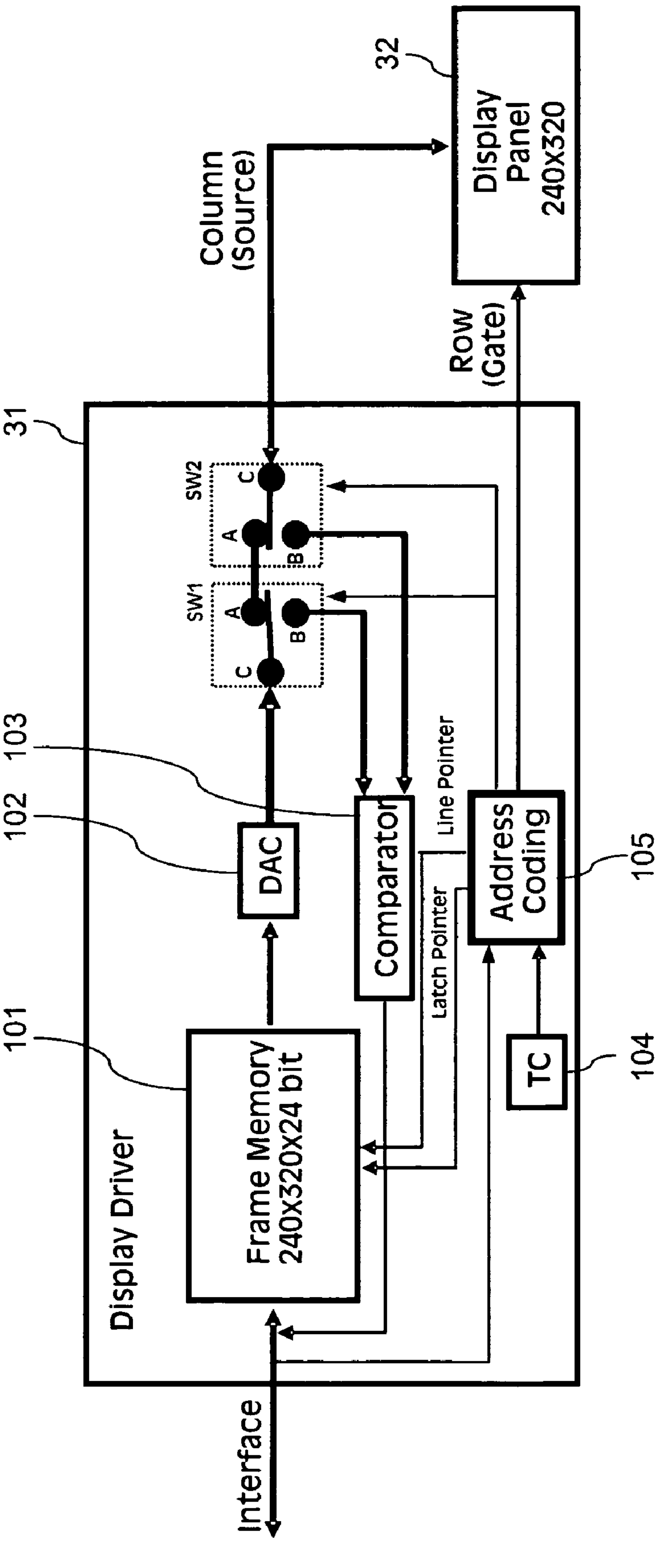
FIG. 10 is a schematic block diagram showing details of an exemplary display driver of the display module of the device of FIG. 3, where the display driver is in a first switching state.

FIG. 10 is a schematic block diagram showing details of an exemplary display driver 31 of the display module 30 of the device 3 of FIG. 3.

The display driver 31 comprises a frame memory 101. The frame memory 101 is suited, for example, to store 240×320×24 bit of digital data for one image frame. With a display panel 32 having 240×320 pixels, thus a digital value of 24 bit can be stored for each pixel. The digital values of 24 bits are stored in columns and rows, which correspond to the column and rows of the pixels of the display panel 32. The frame memory 101 is connected via an interface including the flexible printed circuit 34 to the base band engine 36.

Within the display driver 31, the frame memory 101 is linked via a digital-to-analog-converter (DAC) 102 to a terminal C of a first switch SW1.

Terminal C of the first switch SW1 can be connected either to a further terminal A or to a further terminal B of the first switch SW1. Terminal A of the first switch SW1 is connected to a terminal A of a second switch SW2. A further terminal C of the second switch SW2 can be connected either to terminal A of the second switch SW2 or to a further terminal B of the second switch SW2. Terminal C of the second switch SW2 is connected to the source driver IC 43 of the display panel 32. As mentioned above, the source driver IC 43 may also be integrated in the display driver 31 (not shown).

Terminal B of the first switch SW1 is connected to a first input of a comparator 103. Terminal B of the second switch SW2 is connected to a second input of a comparator 103. The comparator 103 is linked to the interface.

In the depicted situation, terminal C of the first switch SW1 is connected to terminal A of the first switch SW1, and terminal C of the second switch SW2 is connected to terminal A of the second switch SW2. Thus, the DAC 102 is connected to the source driver IC 43 of the display panel 32.

In addition, a timing controller (TC) 104 is linked to an address coding block 105. The address coding block 105 is further linked to a latch control input of the frame memory 101 and to a line control input of the frame memory 101. The address coding block 105 is linked in addition to the gate driver IC 44. As mentioned above, the gate driver IC 44 may also be integrated in the display driver 31 (not shown). The base band engine 36 has moreover a controlling access to the address coding block 105 via the interface.

Both switches SW1, SW2 are controlled by the address coding block 105.

It has to be noted that the comparator 103 and/or the switches SW1, SW2 could also be arranged externally to the display driver 31, for example between the display driver 31 and the display panel 32.

During normal operation, the switches SW1, SW2 are always switched to connect the DAC 102 to the display panel 32. This default switching state is depicted in FIG. 10. The frame memory 101 receives image data for a respective frame via the interface from the base band engine 36. The image data comprises a digital value for each pixel of the display panel 32. Each digital value indicates the digital gray scale value that is required for a pixel cell 45 in the next image frame.

The timing controller 104 sends timing information to the address coding block 105. The timing information could be a simple clock signal. Based on this timing information, the address coding block 105 generates various control signals.

The address coding block 105 determines a latch pointer and a line pointer, indicating which location is to be read from the frame memory 101. The latch pointer indicates a respective column and the line pointer indicates a respective row. Using these pointers, the address coding block 105 selects in the frame memory 101 one digital value after the next of a respective row, which is to be input to the DAC 102. The DAC 102 converts the digital image values into corresponding analog image values, namely corresponding voltage values.

The analog image data is provided to the source driver IC 43, which applies the voltage values of a respective row to the source lines 41, as described above with reference to FIGS. 4 to 6.

The address coding block 105 further selects one of the gate lines 42, which is to be activated by the gate driver IC 44, whenever the latch pointer reached the last column of a row. To this end, the address coding block 105 provides a digital value of '1' for the gate line that is currently to be activated and a digital value of '0' for all other gate lines.

As a result, a row of the pixel cells 45 of the display panel 32 is selected and the analog image data applied to the source lines 41 is stored in the capacitors C associated to this row, as described above with reference to FIGS. 4 to 6.

Then, the address coding block 105 indicates the next gate line 42 to the gate driver IC 44, and the gate driver IC 44 activates the indicated next gate line 42, while the source driver IC 43 has received the analog image values for the next row and applies them to the source lines 41.

Thus, the pixels of one row are updated at the same time, and one row of pixels is updated after the other. The update with data for a new image frame may start for instance at the top of the display panel 32, until the bottom of the display panel 32 is reached. Then, the updating can be started again from the top of the display panel 32 with data for the next image frame.

Figure 11:
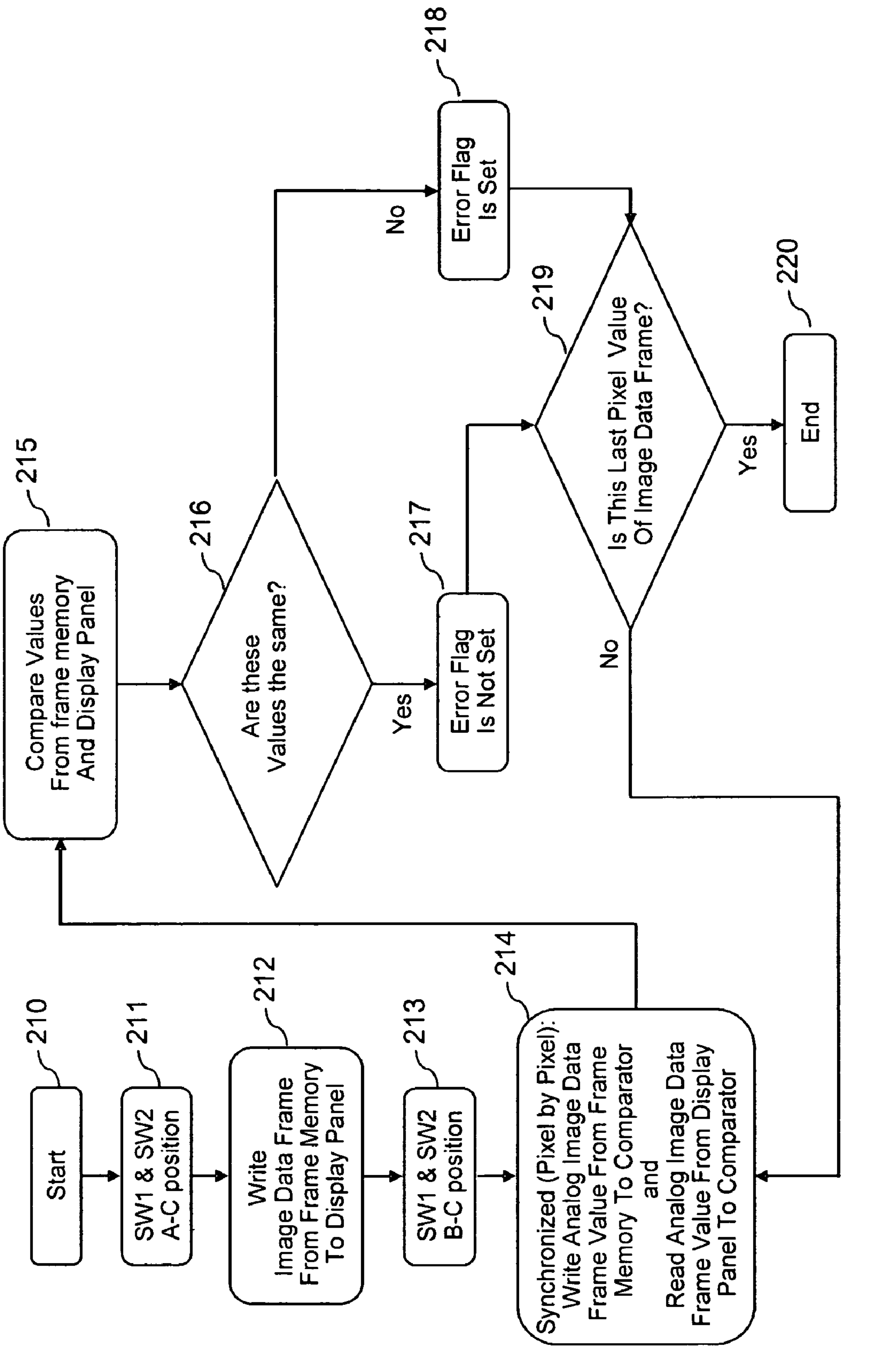
FIG. 11 is a flow chart illustrating a first testing operation in the device of FIG. 3.

FIG. 11 is a flow chart illustrating a first testing operation in the device of FIG. 3.

For starting the testing operation, the processor 37 of the base band engine 36 executes a testing software program code and operates under control of this testing software program code (step 210). The device 3 may comprise in addition a user interface (not shown), which enables a user to cause the processor 37 to enter this testing mode.

The processor 37 selects a first image frame that is to be used for the testing and writes the digital image values for the pixels of this image to the frame memory 101. The first image frame could represent for instance a full white image. The same procedure as described for this image frame with reference to steps 211 to 219 of FIG. 11 could be repeated for example for a full black image, a full red image, a full green image and a full blue image.

The processor 37 moreover sends a special enter test mode command to the display driver 31. This enter test mode command notifies the address coding block 105 that a test mode is to be entered. While the switches SW1 and SW2 are controlled by the address coding block 105, this control is only activated when a test is running.

If the respective terminal C of switches SW1 and SW2 is already connected with respective terminal A of switches SW1 and SW2, as in the situation illustrated in FIG. 10, the address coding block 105 does not change the switching state of the switches SW1, SW2 at this processing stage. Otherwise, the address coding block 105 causes the first switch SW1 and the second switch SW2 to connect respective terminal C with respective terminal A (step 211).

Figure 12:
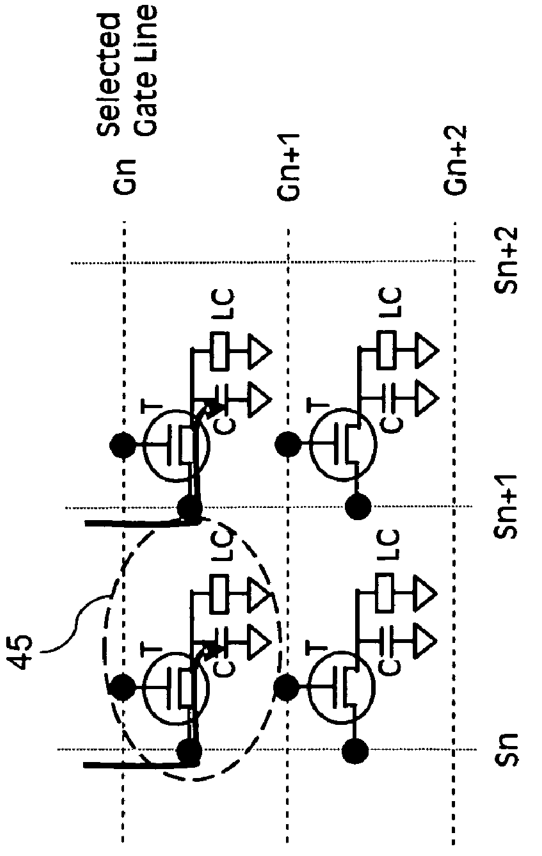
FIG. 12 is a diagram illustrating a writing of image data to a display panel for the testing operation illustrated in FIG. 11.

The image values are then written row by row under control of the address coding block 105 from the frame memory 101 via the DAC 102 to the display panel 32 (step 212). This writing for testing purposes corresponds to the writing during normal operation as described further above with reference to FIGS. 4 to 6 and 10. The writing to the display panel 32 for testing purposes is illustrated in FIG. 12 showing that capacitors C of the pixel cells of row Gn are loaded, and it can be seen that it corresponds to FIG. 5.

Once the entire image has been written to the display panel 32, that is, all capacitors C have been loaded in accordance with the required gray level value, the switches SW1, SW2 are caused to connect respective terminal C to respective terminal B (step 213). This can be realized for instance by means of a control signal or a control voltage from the address coding block 105, which, during the test mode, is provided automatically to the switches SW1, SW2 after the last bit of the frame memory 101 has been addressed.

Figure 13:
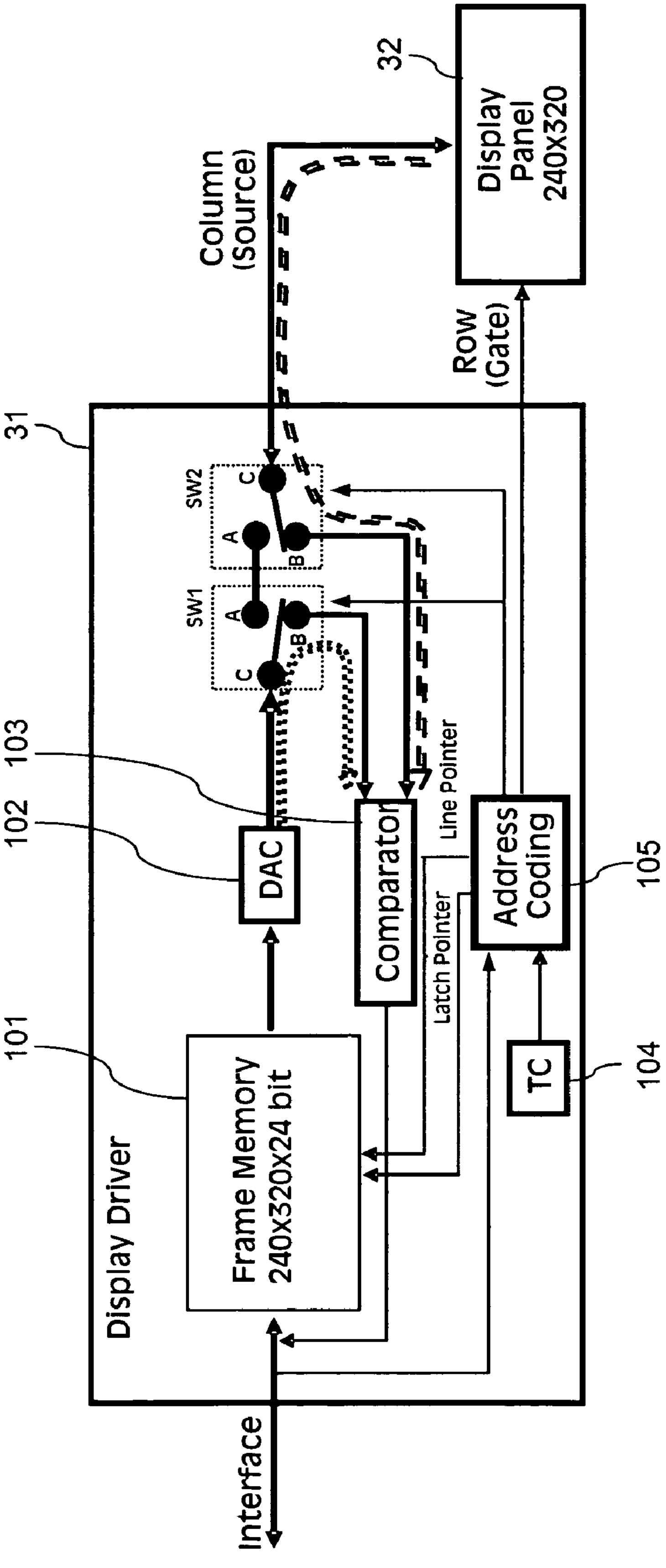
FIG. 13 is a schematic block diagram showing details of an exemplary display driver of the display module of the device of FIG. 3, where the display driver is in a second switching state.

The resulting changed connections are illustrated in FIG. 13. FIG. 13 shows exactly the same components as FIG. 10, but in this case, the DAC 102 is connected via the first switch SW1 to the comparator 103, while the source driver IC 43 of the display panel 32 is connected via the second switch SW2 to the comparator 103.

Next, the same image in the frame memory 101 is used for checking all pixel cells 45 of the display panel 32.

To this end, the digital image values from the frame memory 101 are provided again under control of the address coding block 105 to the DAC 102, as before. Now, however, the corresponding digital image values output by the DAC 102 are provided via the first switch SW1 one by one to the first input of the comparator 103 (step 214). This is indicated in FIG. 13 by an arrow having a dotted double-line.

In parallel and synchronized with this data transfer, the image data stored in the display panel 32 is read from the display panel 32 and provided to the second input of the comparator 103 via the second switch SW2 (step 214). This is indicated in FIG. 13 by an arrow having a dashed double-line.

Figure 14:
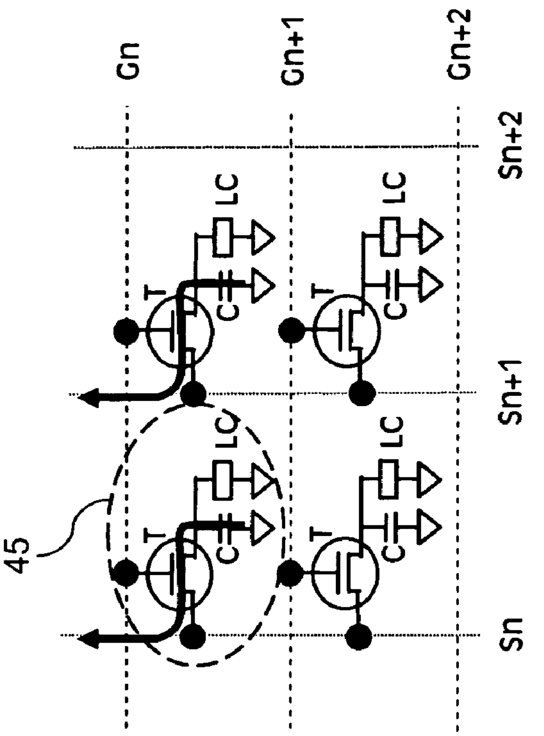
FIG. 14 is a diagram illustrating a reading of image data from the display panel for the testing operation illustrated in FIG. 11.

The reading of image data from the display panel 32 is illustrated in addition in FIG. 14 for one row of pixel cells 45. FIG. 14 is a schematic diagram, which shows again three exemplary source lines Sn, Sn+1, Sn+1 and three exemplary gate lines Gn, Gn+1, Gn+2, and four pixel cells 45 associated to a respective intersection of one of the source lines Sn, Sn+1 and one of the gate lines Gn, Gn+1, just like FIG. 12.

The capacitors C of all pixel cells 45 have been loaded in step 212 with the value required for the associated pixel in the current test image frame.

The address coding block 105 continues indicating one gate line Gn, Gn+1, Gn+2, etc., after the other to the gate driver IC 44. Consequently, the gate driver IC 44 continues activating one gate line Gn, Gn+1, Gn+2, etc., after the other. In the situation depicted in FIG. 14, the gate line Gn is activated. The source driver IC 43, however, does not provide any new voltage signal to the source lines Sn, Sn+1, Sn+2, etc. As a result, the current voltage across the capacitors C of the pixel cells 45 that are associated to the activated gate line Gn can be read via the source of the transistors T in the form of a current and applied by the source driver IC 43 as a voltage value to the comparator 103. The reading of image values from the capacitors C of one row is indicated by arrows in FIG. 14.

Thus, existing source and gate line routings in the display panel 32 can be employed for the pixel cell testing.

The comparator 103 compares pixel by pixel the received values of the analog image data frame stored in the frame memory 101 and the received values of the analog image data frame stored in the display panel 32 (step 215).

A threshold value may indicate a difference below which two compared values should be considered the same and above which two compared values should be considered different.

If the compared values for the same pixel are the same (step 216), no error flag is set by the comparator 103 (step 217). If the compared values for the same pixel are not the same (step 216), an error flag is set by the comparator 103 (step 218).

The flags can be read by the processor 37 of the base band engine 36 via the interface.

The comparison is continued (step 214 to step 219), until the last pixel of the current image data frame has been compared.

The same procedure (steps 211 to 219) is carried out for all test image frames that are required for obtaining comprehensive information on the functioning of the display panel 32.

As a result, the processor 37 of the base band engine 36 is aware how many of the pixel cells 45 of the display panel 32 might not operate correctly.

The processor 37 may collect the result for each pixel of each test image frame in the memory 38, in order to enable a latter processing and combined output of the results.

The testing thus allows checking the functionality of each pixel cell and, in addition, the entire chain the image data takes from the base band engine 36 to the display panel 32.

Once the processor 37 has received the result for the last pixel of the last test image frame, it sends a leave testing mode command to the display driver 31. The address coding block 105 stops thereupon controlling the switches SW1, SW2, and normal operation can be started using the default state of the switches SW1, SW2.

The enter and leave test mode commands might also be used for controlling other components of the display driver 31, for example for activating the comparator 103 upon an enter test mode command and deactivating the comparator 103 upon a leave test mode command.

In a similar manner, various other control voltages or control signals can be tested in an electronic device. This is illustrated by way of example for the provided common voltage VCOM in device 3 of FIG. 3.

Figure 15:
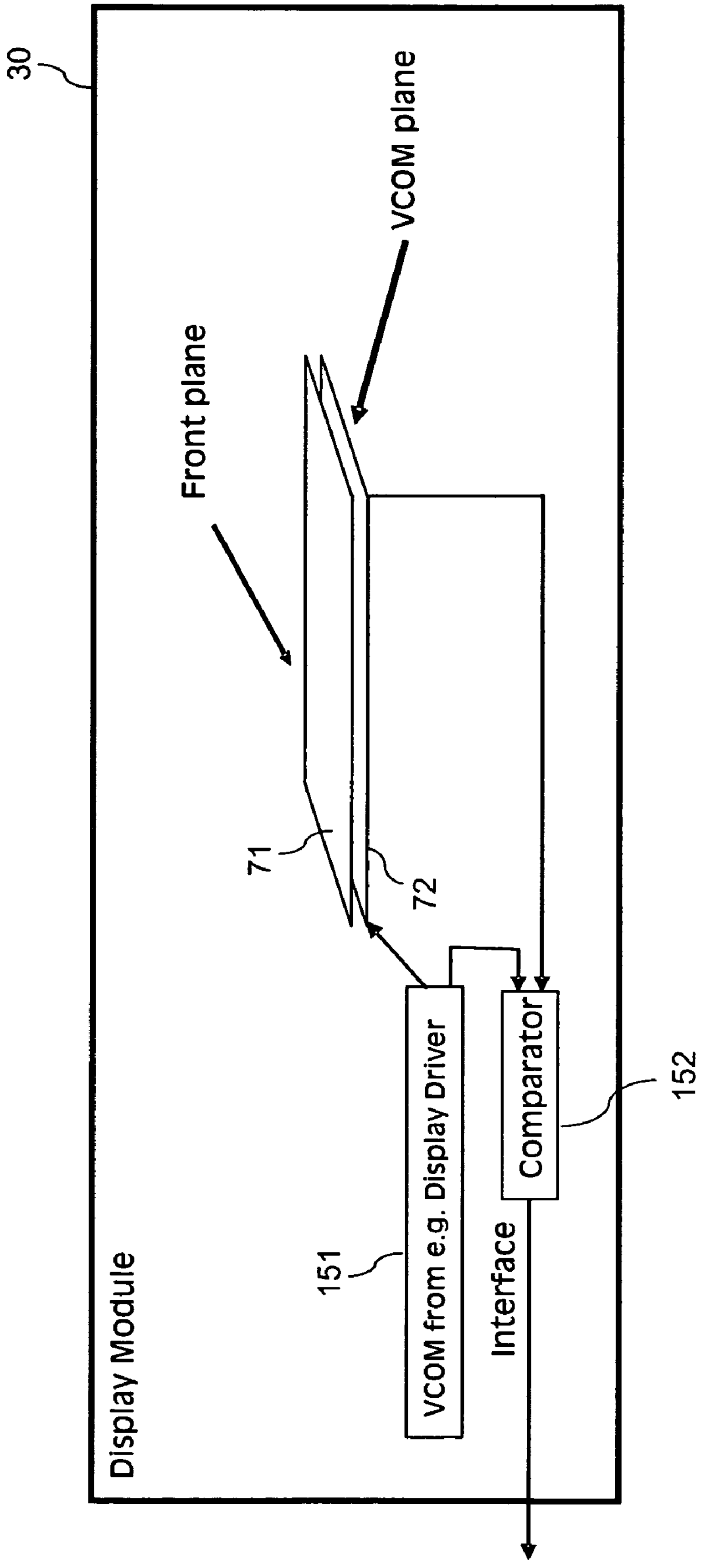
FIG. 15 is a schematic block diagram showing further exemplary details of the display module of the device of FIG. 3.

FIG. 15 is a schematic block diagram of components of the display module 30 that are used for testing the common voltage VCOM. In addition to the front plane 71 and the VCOM plane 72, a VCOM source 151 and a comparator 152 are shown. The VCOM source 151 and the comparator 152 could equally be provided on the display driver 31, but they could also be external to the display driver 31.

The VCOM source 151 is configured to supply the required common voltage to the VCOM plane 72. An output of the VCOM source 151 may be connected to this end for example to a first corner of the VCOM plane 72. In addition, the output of the VCOM source 151 is connected to a first input of the comparator 152. Another corner of the VCOM plane 72 may be connected to a second input of the comparator 152. It has to be noted that the connections to the VCOM plane 72 could also be at other locations, as long as both connections are arranged at two different points.

The output of the comparator 152 can be linked via the interface to the processor 37 of the base band engine 36.

Figure 16:
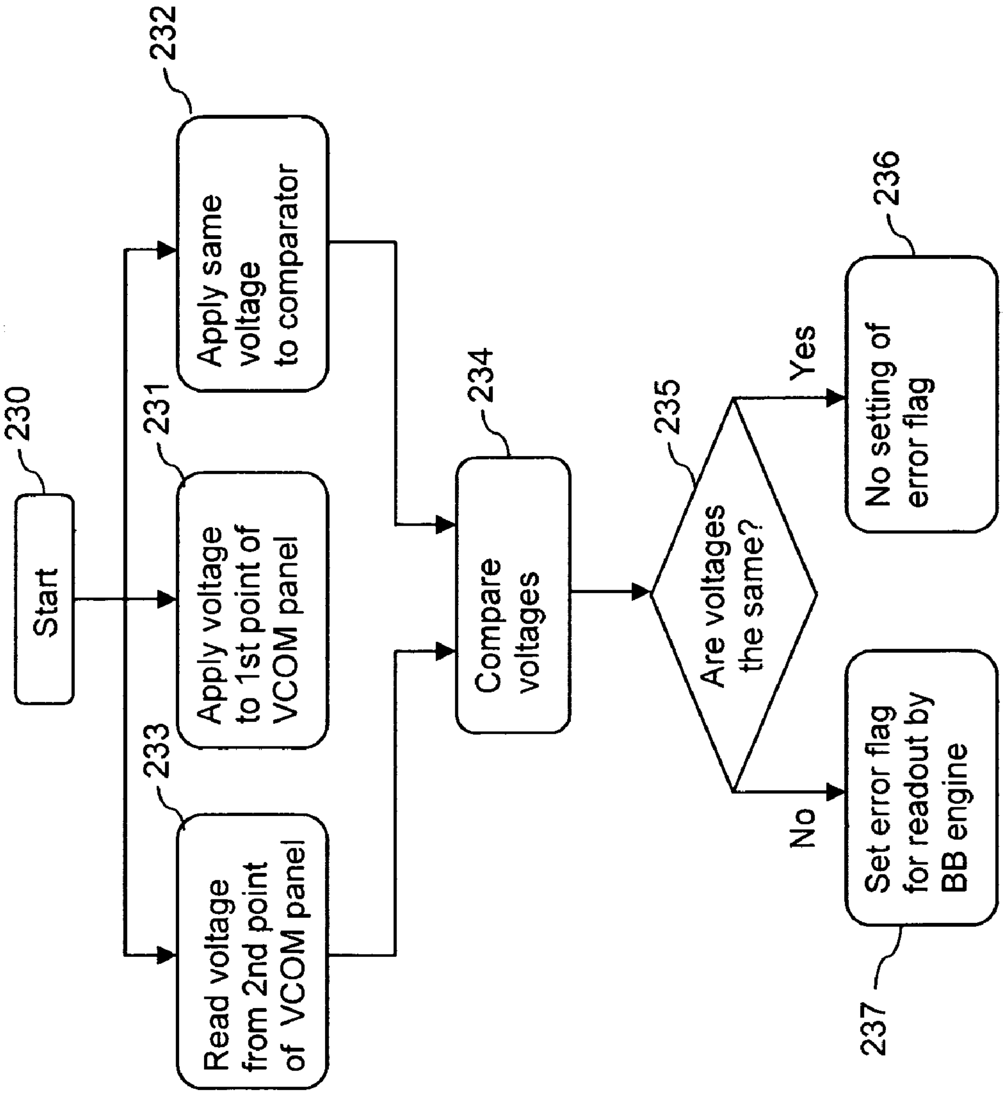
FIG. 16 is a flow chart illustrating a second testing operation in the device of FIG. 3.

The second testing operation is illustrated in FIG. 16.

As a preparatory step, the processor 37 of the base band engine 36 executing the testing software code might activate the comparator 152 for a limited period of time (step 230).

The VCOM source 151 applies the normal common voltage VCOM to a first point, that is, the first corner, of the VCOM panel 72 (step 231). The normal common voltage may have for example a constant level as illustrated in FIG. 8 or a varying level as illustrated in FIG. 9.

In parallel, the VCOM source 151 applies the same voltage to the first input of the comparator 152 (step 232).

Equally in parallel, the available voltage is read from a second point, that is, the second corner, of the VCOM panel 72 and applied to the second input of the comparator 152 (step 233).

The comparator 152 compares the received voltages, which constitute the analog values according to an embodiment of the invention (step 234). A threshold value may indicate a difference, below which the compared voltages should be considered the same and above which the compared voltages should be considered different.

If the voltages are determined to be the same (step 235), no error flag is set by the comparator 152 (step 236). If the voltages are not determined to be the same (step 235), an error flag is set by the comparator 152 (step 237). This error flag may be read out by the processor 37 of the base band engine 36 via the interface.

The processor 37 may collect the result for each applied voltage level in the memory 38, in order to enable a latter processing and combined output of the results.

While the second testing operation described with reference to FIG. 16 is thus similar to the first testing operation described with reference to FIG. 11, for the second testing operation, no switches are required.

Overall, it becomes apparent that the presented exemplary embodiment of the invention enables a comprehensive testing of a display module on the production line without any external visual checking.

The same approach could be used for other analog values, like control voltages, on the display panel or for other analog values on some other component.

The functions illustrated by the front plane 71 and the VCOM plane 72 of the display panel 32 can be viewed as means for receiving at least one analog value. Moreover, the comparators 103 and 152 can be viewed as means for comparing an analog value, which corresponds to an analog value provided to means for receiving at least one analog value, with an analog value read from the means for receiving at least one analog value, and for providing a result of the comparison. Furthermore, the means-plus-function clauses in the claims are intended to cover the structures described herein as performing the recited function and not only structural equivalents, but also equivalent structures.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. An apparatus comprising:

at least one component arranged to be supplied with at least one analog value;

at least one comparator configured to compare at least one analog value, which corresponds to at least one analog value supplied to said at least one component, with at least one analog value read from said at least one component and to provide a result of said comparison; and a signal supply unit configured to provide at least one analog value and arranged to supply said at least one analog value in parallel to said at least one component and to said at least one comparator, said comparator being arranged to receive in parallel said at least one analog value from said signal supply unit and said at least one analog value read from said at least one component.

2. The apparatus according to claim 1, wherein said at least one analog value is at least one voltage.

3. The apparatus according to claim 1, wherein said at least one component comprises an analog memory, and wherein said at least one analog value represents analog memory data.

4. The apparatus according to claim 1, wherein said at least one component comprises a display panel.

5. The apparatus according to claim 4, wherein said at least one analog value represents image data.

6. The apparatus according to claim 4, wherein said at least one analog value comprises an analog value for each pixel of said display panel, and wherein said at least one comparator is configured to compare analog values separately for each pixel of said display panel.

7. The apparatus according to claim 4, wherein said display panel comprises a capacitor for each pixel of said display panel, wherein an analog value provided to said display panel is a voltage loading a capacitor of a respective pixel, and wherein an analog value read from said display panel is a voltage across a capacitor of a respective pixel.

8. The apparatus according to claim 7, wherein said display panel further comprises a switching element for each pixel of said display panel, and wherein a switching element of a respective pixel is arranged to enable in a predetermined switching state a loading of a capacitor of said pixel and a reading of a voltage across said capacitor.

9. The apparatus according to claim 4, further comprising a memory and a digital-to-analog converter, said memory being arranged to provide digital values representing image data to said digital-to-analog converter and said digital-to-analog converter being configured to convert digital values received from said memory into analog values, which are supplied to at least one of said display panel and said at least one comparator.

10. The apparatus according to claim 1, further comprising a switching arrangement, said switching arrangement being arranged to supply in a first switching state at least one analog value from a signal supply unit to said at least one component; and said switching arrangement being arranged to provide in a second switching state at least one analog value from said signal supply unit to said at least one comparator and to provide at least one analog value read from said at least one component to said at least one comparator.

11. The apparatus according to claim 1, wherein said component is a common voltage plane, and wherein said at least one analog value is a common voltage.

12. The apparatus according to claim 1, wherein said apparatus is a display module.

13. A device comprising:

at least one component arranged to be supplied with at least one analog value;

at least one comparator configured to compare at least one analog value, which corresponds to at least one analog value supplied to said component, with at least one analog value read from said component and to provide a result of said comparison;

a processor configured to receive a comparison result from said comparator; and a signal supply unit configured to provide at least one analog value and arranged to supply said at least one analog value in parallel to said at least one component and to said at least one comparator, said comparator being arranged to receive in parallel said at least one analog value from said signal supply unit and said at least one analog value read from said at least one component.

14. The device according to claim 13, wherein said at least one component comprises an analog memory, and wherein said at least one analog value represents analog memory data.

15. The device according to claim 13, wherein said at least one component comprises a display panel.

16. The device according to claim 15, wherein said at least one analog value comprises an analog value for each pixel of said display panel, and wherein said at least one comparator is configured to compare analog values separately for each pixel of said display panel.

17. The device according to claim 13, further comprising a switching arrangement, said switching arrangement being arranged in a first switching state to supply at least one analog value from a signal supply unit to said at least one component; and said switching arrangement being arranged to provide in a second switching state at least one analog value from said signal supply unit to said at least one comparator and to provide at least one analog value read from said at least one component to said at least one comparator.

18. The device according to claim 13, wherein said component is a common voltage plane, and wherein said at least one analog value is a common voltage.

19. The device according to claim 13, wherein said device is a mobile terminal.

20. An apparatus comprising:

means for being supplied with at least one analog value;

means for comparing at least one analog value, which corresponds to at least one analog value supplied to said means for being supplied with at least one analog value, with at least one analog value read from said means for being supplied with at least one analog value and for providing a result of said comparison; and means for providing at least one analog value and for supplying said at least one analog value in parallel to said means for being supplied with at least one analog value and to said means for comparing at least one value, said means for comparing at least one value being arranged to receive in parallel said at least one analog value from said means for providing and said at least one analog value read from said means for being supplied with at least one analog value.

21. A method comprising:

comparing at least one analog value, by at least one comparator, which corresponds to at least one analog value supplied to at least one component, with at least one analog value read from said at least one component and providing a result of said comparison, said at least one component being arranged to be supplied with at least one analog value;

providing, by a signal supply unit, at least one analog value and supplying said at least one analog value in parallel to said at least one component and to said at least one comparator; and receiving in parallel, by said at least one comparator, said at least one analog value from said signal supply unit and said at least one analog value read from said at least one component.

22. The method according to claim 21, wherein said at least one component comprises a display panel, wherein said at least one analog value comprises an analog value for each pixel of said display panel, and wherein said comparing comprises comparing values of analog values separately for each pixel of said display panel.

23. The method according to claim 21, further comprising applying at least one analog value to said at least one component; and providing at least one analog value corresponding to said at least one analog value applied to said at least one component for said comparing and providing at least one analog value read from said at least one component for said comparing.

24. The method according to claim 21, further comprising in parallel:

supplying at least one analog value to said at least one component and providing said at least one analog value for said comparing; and providing at least one analog value read from said at least one component for said comparing.

* * * * *